United States Patent [19]

Heinonen

[11] Patent Number: 5,335,364
[45] Date of Patent: Aug. 2, 1994

[54] CIRCUIT ARRANGEMENT FOR AUTOMATIC FREQUENCY CONTROL IN A RADIO TELEPHONE

[75] Inventor: Jarmo Heinonen, Salo, Finland

[73] Assignee: Nokia Mobile Phones, Ltd., Salo, Finland

[21] Appl. No.: 839,383

[22] Filed: Feb. 21, 1992

[30] Foreign Application Priority Data

Feb. 22, 1991 [FI] Finland .................... 910861

[51] Int. Cl.⁵ .................... H04B 1/40; H04B 1/16
[52] U.S. Cl. .................... 455/76; 455/182.2; 455/192.2; 455/264; 455/265
[58] Field of Search ............ 455/75, 76, 182.2, 192.2, 455/208, 255, 256, 257, 258, 259, 260, 264, 265, 316, 182.1, 192.1; 375/97

[56] References Cited

U.S. PATENT DOCUMENTS

| | | | |
|---|---|---|---|
| 4,817,197 | 3/1989 | Shimizu et al. | 455/208 |
| 4,932,072 | 6/1990 | Toko | 455/76 |
| 5,073,973 | 12/1991 | Ylivakeri | 455/76 |
| 5,115,515 | 5/1992 | Yamamoto et al. | 455/260 |
| 5,170,492 | 12/1992 | Moller et al. | 455/76 |

FOREIGN PATENT DOCUMENTS

| | | |
|---|---|---|
| 0098653 | 1/1984 | European Pat. Off. . |
| 0176303 | 4/1986 | European Pat. Off. . |
| 0070218 | 3/1991 | Japan ................. 455/76 |
| 2213664A | 8/1989 | United Kingdom . |

Primary Examiner—Reinhard J. Eisenzopf
Assistant Examiner—Nguyen Vo
Attorney, Agent, or Firm—Perman & Green

[57] ABSTRACT

The present invention relates to a circuit arrangement by which a voltage-controlled temperature-compensated oscillator (VCTCXO) (10) serving as the frequency reference in a radio telephone is controlled. In the circuit arrangement there is used a phase-locked loop which locks the frequency of the VCTCXO (10) to the frequency of the intermediate-frequency signal (2.IF) of the receiver of the telephone. When the telephone is started up, a constant setting voltage (30) is coupled as the control signal ($V_{con}$) for the VCTXCO (10) for controlling the reference frequency. In the call state the control signal ($V_{con}$) is provided by by the phase-locked loop in which the locking is to the frequency of the intermediate frequency signal. When the call is cut off the control voltage ($V_{con}$) is supplied from a memory (26) coupled to the phase-locked loop in which the value of the control signal ($V_{con}$) is substantially equal to the control signal ($V_{con}$) supplied by the phase-locked loop at the moment of cut-off, and which has been stored in the memory (26).

2 Claims, 2 Drawing Sheets

CIRCUIT ARRANGEMENT FOR AUTOMATIC FREQUENCY CONTROL IN A RADIO TELEPHONE

The present invention relates to a circuit arrangement by means of which a voltage-controlled temperature-compensated oscillator serving as the reference frequency in a radio telephone is controlled so that the telephone is locked to the carrier wave during the reception of a signal from the transmitting station.

In multi-channel radio telephones, such as a modern mobile telephones, the mixer frequencies of the receiver and the transmitter, i.e. the first and second local-oscillator frequencies of the receiver and the first and second shift-oscillator frequencies of the transmitter, are often produced by synthesizers from a reference frequency of the radio telephone itself. Synthesizers for the generation of signals may number one or more. Synthesizers are made up of a phase-locked loop, the output frequency of which is locked to the reference frequency which is one of the inputs to a phase detector of the loop. The reference frequency, for its part, is produced by a voltage-controlled temperature-compensated crystal oscillator (VCTCXO), since, without voltage control, the frequency of a crystal oscillator manufactured by present-day techniques is not sufficiently precise and its frequency stability not sufficient, so that the frequencies produced by the synthesizers deviate too much from those permissible, and thus the frequency deviation with respect to the carrier wave would be too large. A permissible frequency deviation from the nominal frequency is, for example, in a Nordic Mobile Telephone (NMT)-900 system ±0.8 ppm. Various automatic frequency control (AFC) methods are generally used for controlling the VCTCXO. The basic idea in the AFC methods is that the reference frequency is in one way or another locked to the received carrier wave frequency, because the carrier wave frequency transmitted by the transmitting station, eg. a base station in a cellular network, is very stable. According to the general principle, the telephone's own first local-oscillator frequency is compared with the frequency of the received signal, and the telephone's own oscillator frequency, which constitutes the reference frequency, is controlled on the basis of the frequency difference.

One modern AFC method is disclosed in Finnish Patent FI-79636, of Nokia Mobile Phones Ltd. Therein a constant time period is formed from the frequency of a crystal oscillator connected to the processor, and during this constant time period the cycles of the signal which has been received by the counter and been shifted to a second intermediate frequency are counted. The result of the counting is in digital form and is used, after digital-to-analog (D/A) conversion, for the control of the VCTCXO. This method and many other methods using the carrier wave frequency are substantially based on the use of a processor, which performs the control and the counting. In the RF modules of the telephone there is thus required, simply for AFC, an intermediate-frequency signal buffer, an outgoing intermediate-frequency signal line, and an incoming VCTCXO control line. The AFC function itself, i.e. the counting and the control, is performed in the audio-/logic modules of the telephone by using the processor and its peripheral circuits. The AFC function additionally requires information regarding the received signal intensity and a memory in which the correct VCTCXO control data, i.e. the frequency information, is stored. The storage of the frequency information is indispensable considering situations in which the signal received from a base station is momentarily lost (in an NMT system the maximum waiting time is approx. 4 minutes). In an NMT-system the AFC function must not control the output frequency so that it deviates no more than 4 kHz from the nominal frequency, regardless of the frequency of the signal coming from the base station. Nevertheless, the control must be capable of correcting a possible 2.5 kHz error caused by the temperature drift of the VCTCXO. The advantage of such known methods is that the limits for the reference frequency can be set in software, and that the latest control voltage value will remain in the memory when the signal being received fades out.

The prior-art AFC methods have the disadvantage that they use up processor capacity by using its program memory space. On the other hand, the loading is intermittent. In addition, counters are required, as well as at least the above-mentioned control lines and numerous connections between the radio frequency modules and the logic modules.

According to the present invention, there is provided a circuit arrangement for control of the frequency of a frequency generator coupled to a mixer of a radio transceiver and to a voltage controlled oscillator for receiving a reference signal therefrom, and comprising means for detecting the strength of a received signal and supplying an indicating signal in response thereto, a phase-locked loop, including the voltage controlled oscillator, which in response to the indicating signal, controls the voltage controlled oscillator by a first control signal supplied thereto such that the frequency of the reference signal is locked to the frequency of the received signal, and means for supplying a second control signal to the voltage controlled oscillator when the indicating signal falls below a predetermined level, the value of the second control signal substantially corresponding to the value of the first control signal prior to the indicating signal falling below the predetermined value. This has the advantage that the AFC function can in its entirety be implemented without programming, by using only the hardware, and entirely in the radio frequency modules, in which case it is possible during manufacture to integrate the AFC function on the same silicon chips as the other RF modules and thus to reduce the space requirement. Also, AFC counting and updating need not be carried out as in prior-art methods.

In a preferred embodiment, the phase-locked loop includes a phase detector having two inputs for receiving first and second input signals, the first input signal being derived by dividing an intermediate frequency signal generated in the receiver of the transceiver from the received signal in a first divider, and the second input signal being derived from the reference signal divided in a second divider, and an output which may be selectively coupled by means of a switch to the voltage controlled oscillator to supply a filtered output voltage as the first control voltage, and the second control signal supply means comprises a memory circuit coupled to the output of the phase detector such that the output voltage of the phase comparator can be stored in the memory circuit and which can be selectively supplied by means of the switch as the second control voltage, when the indicating signal falls below the predetermined level. Thus, the only external information required is the intermediate-frequency signal and the information on the strength of a received signal, i.e. the indicating signal. These are easily available. The intermediate frequency signal can be taken from a suitable point in the intermediate-frequency circuit and, since the field intensity of the received signal is always measured in present-day telephones, this signal can be used. In an NMT-phone, the signal is an RSSI direct voltage (DC-voltage relative to received signal strength).

In a preferred embodiment, the arrangement further comprises, means for supplying a constant voltage as a third control voltage to the voltage controlled oscillator and selectable, by operation of the switch, in a start-up mode, or after a predetermined period where the indicating signal has been below two predetermined level for a predetermined period.

The memory circuit may include an analog-to-digital converter (ADC), coupled to a latch circuit and a digital-to-analog converter (DAC) coupled to the latch circuit for providing the means for supplying the first or second control signal to the voltage controlled oscillator.

A further advantage of the invention is that the second intermediate-frequency signal and the control signal for the voltage-controlled oscillator need not be combined between two modules, i.e. the high-frequency module and the digital/processing module, as is necessary in prior-art methods. As mentioned above, it provides an opportunity for the integration of the RF modules and functions in order to implement ever smaller radio telephones. The integrated entity will be considerably large if the AFC function according to the invention is integrated together with, for example the intermediate frequency circuit. The automatic frequency control is precise, since the only sources of error are the second local-oscillator error (if it has not been synthesized) and the errors produced by the ADC and the DAC.

According to the basic idea of the invention, at the time of the switch-on of the telephone, a fixed setting voltage is switched as the control voltage, in the call state the control voltage for the voltage-controlled frequency reference is formed by means of a phase-locked loop in which the locking is to the frequency of an intermediate-frequency signal, and when the call is cut off the control voltage remaining will be the control voltage produced by the phase-locked loop at that time.

The voltage controlled temperature compensated oscillator (VCTCXO) frequency is controlled by using a phase-locked loop in which the VCTCXO frequency, which constitutes a reference frequency, is locked to the frequency of an intermediate-frequency signal. The intermediate-frequency signal is taken from a suitable point in the intermediate-frequency module and applied, via a divider, to a phase detector, to which the VCTCXO frequency, suitably divided, is also applied. The phase detector compares these frequencies and generates a differential voltage proportional to the phase difference, and this differential voltage is applied, after being filtered, to the control input of the VCTCXO. When the loop is in equilibrium, the VCTCXO frequency is locked to the intermediate frequency, and thus to the received carrier-wave frequency. If there is a failure in the call, i.e. the signal received from the transmitting station deteriorates, the loop has at a point after the phase detector, a memory device in which the control voltage produced by the phase detector a moment before the deterioration in the radio link is stored. For the duration of the deterioration the VCTCXO receives its control voltage from this memory device, and after the deterioration is over, the voltage received from the phase detector is again switched as the control voltage. For the telephone switch-on situation, an initial value is required for the VCTCXO control voltage, and for this purpose the loop has, at a point after the phase detector, also a controllable switch by means of which a fixed setting voltage is supplied as the control voltage, in which case the telephone will function on the basis of its own frequency reference. When the carrier wave is detected, the said switch again couples as the control voltage the filtered output voltage of the phase comparator, whereupon locking to the carrier wave occurs in the manner described above.

The invention is described below, by way of example only, with reference to the accompanying figures, of which:

Figure 1:
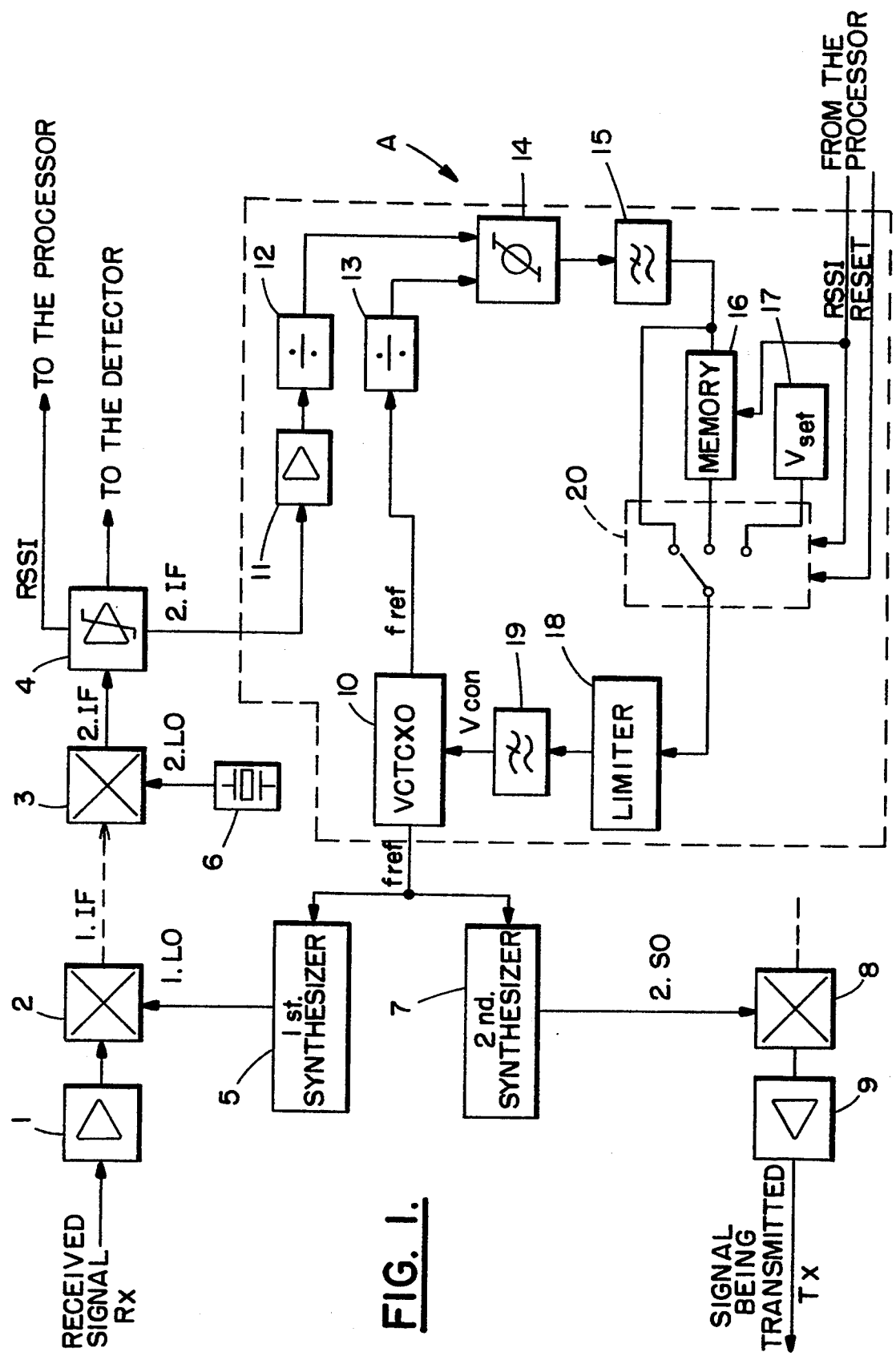
FIG. 1 depicts schematically the basic principle of the invention.

FIG. 1 depicts an AFC function according to the invention, placed in the RF modules of a radio telephone. The received signal Rx arrives from a duplexer via an amplifier 1 to a mixer 2, in which the signal Rx is mixed with a first local-oscillator frequency signal 1.LO, and the resultant first intermediate-frequency signal 1.IF is applied to a second mixer 3 in order to be mixed with a second local-oscillator frequency 2.LO, whereby a second intermediate-frequency signal 2.IF is obtained. This signal is applied, for example, via a limiter amplifier 4 to a detector circuit. This chain is known to persons skilled in the art, and therefore the conventional filters and amplifiers therein are not described. In a corresponding manner in the transmitter branch the signal to be transmitted is shifted to the transmission frequency in a mixer 8, in which the signal is mixed with a second shift-oscillator frequency signal 2.SO, the resultant signal Tx having the carrier wave frequency. The carrier-wave frequency signal Tx can also be obtained directly, without mixing, by applying modulation directly to a voltage-controlled oscillator (VCO) of the transmitter-side synthesizer 7. The transmitter chain, which is not described here in greater detail, is in itself conventional. The first local-oscillator frequency signal 1.LO and the second shift-oscillator frequency signal 2.SO are produced by frequency synthesizers 5, 7 from the reference frequency $F_{ref}$ of the telephone. The synthesizers are implemented by using a respective phase-locked loop in a known manner. The second local-oscillator frequency signal 2.LO and a first shift-oscillator frequency signal can be produced using a crystal oscillator (only oscillator 6 is shown) or also using synthesizers.

The dotted lines indicate the AFC block A according to the invention, in which a VCTCXO 10 frequency constituting the reference frequency $F_{ref}$ is controlled.

In the call state i.e. when the telephone is receiving and transmitting signals, the received signal strength information (RSSI) voltage supplied by the processor and indicative of the strength of the signal received by the receiver is, for example, above a predetermined level, which means that the field intensity of the signal being received is acceptable. In this case the procedure is as follows: an intermediate signal, for example the second intermediate-frequency signal 2.IF, is applied via a buffer 11 and a divider 12 to one input of a phase detector 14, and the signal of frequency $F_{ref}$ obtained from the VCTCXO 10, which has first been divided in the divider 13, is applied to the other input of the phase detector 14. If the intermediate frequency is, for example, 455 kHz and $F_{ref}$ is 12.8 MHz, a divisor of 91 would be suitable for the divider 12 and a divisor of 2560 for the divider 13. In this case, input signals of 5 kHz will arrive at the phase detector 14. The dividers preferably have fixed divisors, in which case they will not require control lines for the input of divisors. From the phase detector 14 there is obtained a pulse train proportional to the phase difference of the input signals, and the pulse train is filtered in a filter 15 into a direct voltage and is applied via a change-over switch 20 to a limiter block 18, which sets the upper and lower limits for a control voltage $V_{con}$. The voltage limiting can be implemented simply by using a voltage divider. The direct voltage produced by the phase detector 14 is finally applied to a loop filter 19, which attenuates the results of the division, for example, via an RC filter, to the VCTCXO 10, as its control voltage $V_{con}$. This controls the VCTCXO so that its frequency $F_{ref}$ is locked to the second intermediate-frequency signal 2.IF. Since the components described above form a phase-locked loop, the frequency of the VCTCXO 10 follows very precisely the intermediate frequency, so that locking to the intermediate frequency and thereby to the carrier-wave frequency will always occur in a call state.

If the Rx signal being received deteriorates, i.e. the RSSI voltage proportional to its field intensity falls below a predetermined level, the switch 20 turns to the output of the memory M indicated by block 16 in FIG. 1 in which the voltage value which prevailed immediately before the moment of the cut-off and which is obtainable from the filter 15 has been stored. The structure of the memory M will be described later. For the duration of the cut-off of the received signal Rx, or for a certain maximum period, for example 4 minutes, the voltage stored in the memory M remains and is used to provide control voltage $V_{con}$ for the VCTCXO 10, whereafter, when the received signal Rx returns, i.e. when the RSSI voltage received from the processor increases above the predetermined value, the switch 20 turns in such a way so as to lock to the second intermediate frequency signal 2.IF using the loop. In order for the operation to be correct, the delay of the RSSI data must be less than the speed of the loop controlling the VCTCXO 10, otherwise an erroneous value would be stored in the memory M.

When the telephone is switched-on, at which time there naturally is no carrier wave signal, the switch 20 is turned by a RESET control signal to the setting voltage $V_{set}$ supply, indicated by block 17 in FIG. 1. This constant setting voltage $V_{set}$ serves as the basic setting for the control voltage $V_{con}$, the telephone operating on the basis of its own reference frequency until a base station signal is detected. Thereafter the RESET control signal turns the switch 20 to the loop circuit. The setting voltage $V_{set}$ can also be used for providing the control voltage if a cut-off in a call exceeds a predetermined time. The RESET control signal can also be taken from, for example, a synthesizer 1 control line (divisor input line).

Figure 2:
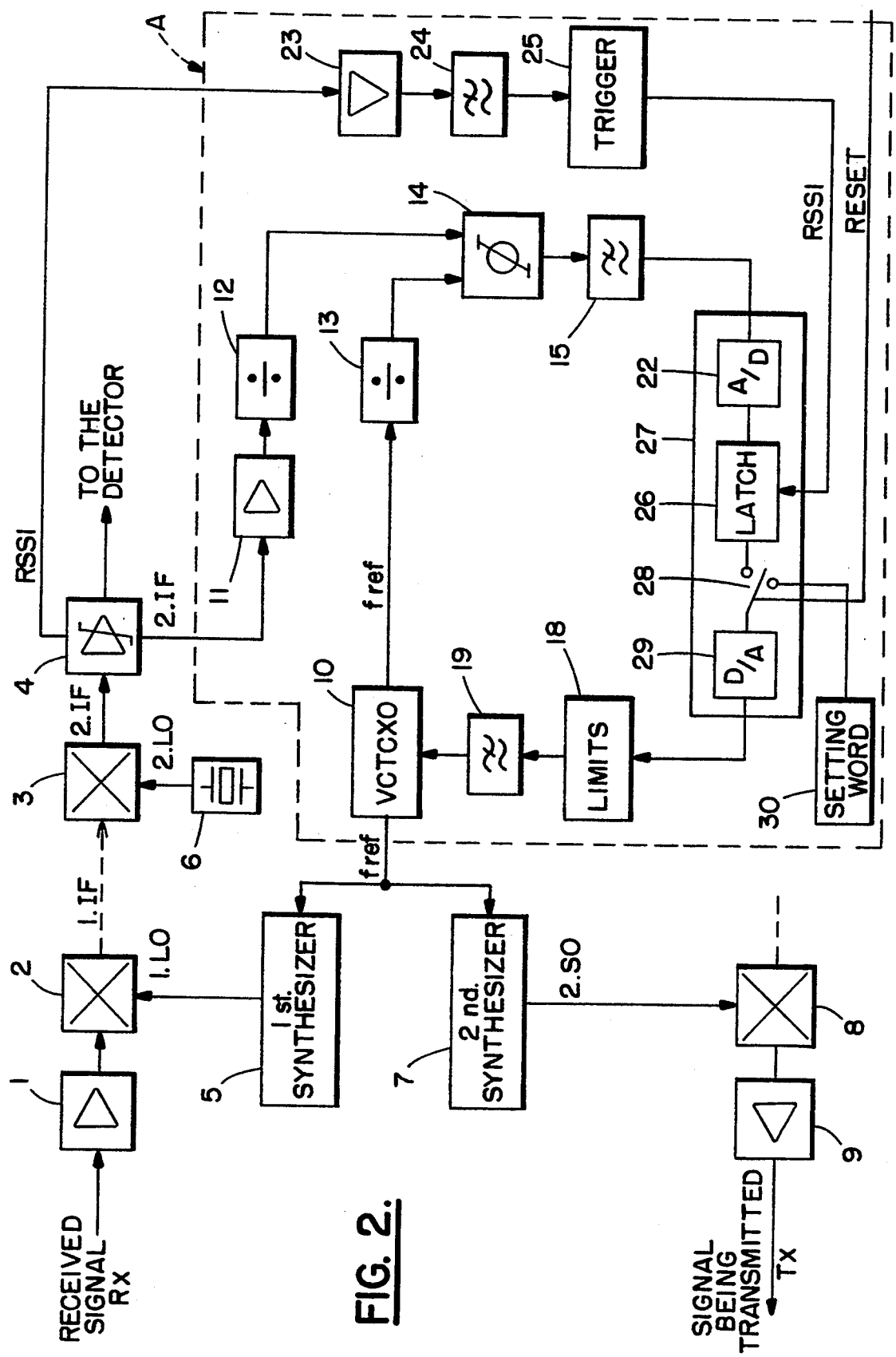
FIG. 2 depicts a practical embodiment of the invention.

The circuitry according to FIG. 1, primarily with respect to the change-over switch 20, the memory M, and the setting voltage $V_{set}$, illustrates the idea of the invention. FIG. 2 shows one practical implementation.

The memory circuit has been implemented, by way of example, using an Analog-to-Digital Converter (ADC) 22, a latch circuit 26, and a Digital-to-Analog Converter (DAC) 29. The control voltage $V_{con}$ for the VCTCXO 10, is obtained from the DAC 29. RSSI information is not in this example obtained from the processor, but rather directly from the receiver, in which the intermediate frequency signal components produced in a limiter amplifier 4 is amplified, when necessary, by an amplifier 23 and is then filtered by a filter 24 to provide the RSSI voltage. The filtered RSSI voltage then controls a trigger 25 so that, when the RSSI voltage is above a predetermined level, i.e. when a base station signal is being received, the trigger releases the latch circuit 26, and when the voltage RSSI drops below a certain limit, i.e. when the signal being received deteriorates, the trigger 25 locks the latch circuit 26. When the telephone is being switched on, the RESET signal turns the switch 28 to a fixed setting word 30, which can be implemented, for example, using DIP switches or push-up/pull-down resistors. The DAC 29 converts the setting word 30 into a control voltage $V_{con}$ to be applied to the VCTCXO. Thereupon the telephone functions on the basis of its own reference frequency $F_{ref}$. When a base station transmission signal is detected, the RSSI voltage increases above a predetermined level and the trigger 25 triggers open the latch circuit 26, and at the same time the RESET control signal switches, by means of switch 28, the DAC 29 to the latch circuit 26. The phase comparator 14 compares the frequency of the VCTCXO 10 with the frequency of the intermediate-frequency signal and produces, in accordance with the above, a voltage which is applied via the ADC 22, the latch circuit 26 and the DAC 29 as the control voltage $V_{con}$ to the VCTCXO 10. The VCTCXO 10 is thereupon locked to the frequency of the intermediate-frequency signal. If the received signal Rx being received deteriorates, the RSSI voltage drops below a predetermined value and the trigger 25 triggers the latch circuit 26 to the locking state, whereupon the phase detector 14 output voltage which prevailed immediately before the cut-off will remain in the memory in the latch circuit 26. This now serves as the input word of the DAC 29, and the output from the DAC is constant for the duration of the cut-off. If the received signal Rx returns, the trigger 25, triggered by the increasing RSSI voltage, switches the latch circuit 26 open, whereupon the output voltage of the phase comparator 14 will be supplied to the control input of the VCTCXO 10. If the cut-off period is long, a fixed setting word 30 can be switched by means of the RESET signal as the input of the DAC 29. It is a prerequisite of the procedure described above that the delay of the RSSI signal is less than the speed of the loop.

In view of the foregoing description it will be evident to a person skilled in the art that various modifications may be made within the scope of the present invention, for example, the loop circuit may have also other blocks than those described, for example filters and amplifiers, the dividers 12 and 13 may be programmable dividers, etc. The memory and switching block 18 can be implemented also in other ways than that described, while still remaining within the scope of protection of the patent claims. Instead of the second intermediate frequency signal, the 1st intermediate frequency signal, or on certain conditions directly the signal Rx being received can be applied to the phase comparator.

I claim:

1. A circuit for controlling a frequency of a frequency signal generator that provides a local oscillator signal to a mixer in a radio frequency section of a radio transceiver, said circuit comprising:

a voltage controlled oscillator (VCO) connected to said frequency signal generator for generating a reference frequency signal;

means for deriving an intermediate frequency signal from an input signal to said radio transceiver wherein said input signal is coupled to an input of said mixer and said intermediate frequency signal is outputted from said mixer;

detector means for determining a signal strength of said intermediate frequency signal and for providing a signal strength indication thereof;

phase detector means having first and second inputs;

divider means responsive to said intermediate frequency signal and said reference frequency signal to derive therefrom equal frequency signals and to apply said equal frequency signals as inputs to said first and second inputs, respectively, said inputs causing said phase detector means to output a first control signal indicative of a phase difference between said equal frequency signals;

switch means connected to receive said indication from said detector means and said first control signal, for selectively applying said first control signal to said VCO so as to maintain said reference frequency signal phase locked to said input signal, said switch means including memory means for storing values of said first control signal, said memory means comprising a latch circuit for storing digital values, an analog to digital converter connected to receive said first control signal and to apply a digital value corresponding to said first control signal to said latch circuit for storage, and a digital to analog converter connected to receive a stored digital value from said latch circuit, said switch means responsive to said signal strength indication exceeding or equalling a threshold to apply said first control signal to said VCO and to a decrease of said signal strength indication below said threshold, to cause said latch circuit to apply a stored value of said first control signal via said digital to analog converter to said VCO, said value of said first control signal stored in said latch circuit just prior to said decrease;

constant voltage means connected to said switch means, said switch means applying during a start-up mode, an output from said constant voltage means to said VCO as a second control signal to set the reference frequency signal to a predetermined frequency; and means for controlling said switch means to apply said second control signal to said VCO if said signal strength indication from said detector means falls and remains below said threshold for a predetermined period.

2. The circuit as recited in claim 1 wherein said means for controlling applies during said start-up mode, a control signal to said switch means to cause an input to said digital to analog converter to be coupled to receive said second control signal, said second control signal applied thereto as a digital value.

* * * * *